US006250374B1

(12) United States Patent
Fujino et al.

(10) Patent No.: US 6,250,374 B1
(45) Date of Patent: Jun. 26, 2001

(54) APPARATUS AND METHOD FOR TREATING SUBSTRATES

(75) Inventors: Naoto Fujino, Oume; Naoki Watanabe, Kodaira, both of (JP)

(73) Assignee: Anelva Corporation, Tokyo (JP)

( * ) Notice: Subject to any disclaimer, the term of this patent is extended or adjusted under 35 U.S.C. 154(b) by 0 days.

(21) Appl. No.: 09/218,371

(22) Filed: Dec. 21, 1998

(30) Foreign Application Priority Data

Jan. 12, 1998 (JP) .................................................. 10-016348

(51) Int. Cl.[7] ........................................................ F28F 7/00
(52) U.S. Cl. ........................ 165/80.1; 165/80.2; 165/185; 34/71; 118/724
(58) Field of Search .................................. 165/80.1, 80.2, 165/80.4, 185; 118/724, 728; 34/71, 95

(56) References Cited

U.S. PATENT DOCUMENTS

| 4,261,762 | 4/1981 | King . |
| 4,457,359 | 7/1984 | Holden . |
| 4,512,391 | 4/1985 | Harra . |
| 4,558,388 | 12/1985 | Graves, Jr. . |
| 4,680,061 | 7/1987 | Lamont, Jr. . |
| 4,909,314 | 3/1990 | Lamont, Jr. . |
| 4,969,511 | 11/1990 | Person . |
| 5,113,929 | 5/1992 | Nakagawa et al. . |
| 5,115,858 | 5/1992 | Fitch et al. . |
| 5,131,460 * | 7/1992 | Krueger ............................. 165/80.2 |
| 5,181,556 | 1/1993 | Hughes ............................. 165/80.1 |
| 5,199,483 | 4/1993 | Bahng ............................... 165/80.1 |
| 5,287,914 | 2/1994 | Hughes . |
| 5,705,044 * | 1/1998 | Washburn et al. ............... 204/298.25 |

FOREIGN PATENT DOCUMENTS 62-54933 * 3/1987 (JP) .................................... 165/80.1

OTHER PUBLICATIONS

Cuomo, J.J. "Heat Transfer Process for High Thermal Input Processes", IBM Technical Disclosure Bulletin, vol. 21, No. 2, Jul. 1978.

Hammer, W.N. "Cooling Ion–Implantation Target", IBM Technical Disclosure Bulletin, vol. 19, No. 6, Nov. 1976, pp. 2270–1.

King, M. et al. "Experiments on Gas Cooling of Wafers" Nuclear Instruments and Methods 189: 169–173, pp. 169–73, 1981.

* cited by examiner

Primary Examiner—Leonard Leo

(57) ABSTRACT

An apparatus and method for cooling substrates is disclosed wherein the apparatus contains a cooling mechanism having a cooling plate, components for circulating a cooling fluid through the cooling plate, a positioning mechanism which positions the substrate relative to the cooling plate during operation of the apparatus and a housing for containing the cooling mechanism, the positioning components and the circulating components. The cooling plate has a non-planar top surface which provides an enlarged surface area used to cool the substrate. The cooling apparatus may be used in conjunction with a larger processing apparatus to fabricate an information storage disk.

18 Claims, 4 Drawing Sheets

APPARATUS AND METHOD FOR TREATING SUBSTRATES

FIELD OF THE INVENTION

The present invention generally relates to the production of information recording disks and, more particularly, to the cooling of the substrates used to fabricate information recording disks.

BACKGROUND OF THE INVENTION

Information recording disks such as magnetic recording disks used, for example, in "hard disks," compact disks, etc. have a structure where a recording layer is formed on the surface of a substrate which is made of a metal or dielectric material. In making a magnetic disk used in a hard disk, a substrate of aluminum (Al), or other suitable metal or dielectric material is first coated with a nickel-phosphorus (NiP) layer. Next, an undercoat metal film of suitable material is deposited on a surface of the substrate and then a recording layer made from a thin magnetic film of suitable material is deposited on the metal film layer. The recording disk is completed by depositing a protective layer over the recording layer.

The protective layer must be composed of a durable film which has lubricating properties in order to shield the recording layer from impact and harsh environments. For example, sputtered carbon films (carbon films which have been deposited by sputtering) are commonly used as protective layers.

In a conventional fabrication process, the recording layer is deposited onto the substrate surface at relatively high temperatures (for example, about 200° C.–250° C.) to ensure that the recording layer has a high coercive force. It is important that the recording layer have good magnetic properties to provide reliable transfer of data to and from the magnetic recording layer. On the other hand, the protective layer is deposited at lower temperatures of, for example, about 100° C.–150° C. Thus, before the protective layer can be deposited, the recording disk must be cooled to a suitable temperature for deposition.

Conventionally, such cooling has been accomplished by natural heat loss, or radiation, from the recording disk. Natural heat loss, however, can be a time-consuming process as temperatures do not readily decrease in the vacuum environment commonly employed in the fabrication of information recording disks. Consequently, manufacturing "throughput" and, potentially, recording disk quality may be adversely affected.

SUMMARY OF THE INVENTION

The aforementioned and related drawbacks associated with conventional information recording disk fabrication are eliminated or substantially reduced by the apparatus and associated method for treating substrates according to the present invention. The present invention calls for the cooling of a substrate used in the fabrication of an information recording disk with a gas by means of a cooling apparatus, including a cooling block, having a non-planar surface facing the substrate to be cooled. The non-planar surface of the cooling block is established by closely packing grooves which may have a V-shaped cross-section, a conical cross section, or a pyramidal cross-section. Preferably the grooves further include protrusions formed thereon. The protrusions of the present invention may be formed on the surface of the grooves through a blasting or other suitable process. By providing a cooling block with a non-planar structure, the effective surface area of the cooling block is at least doubled which, in turn, enhances the substrate cooling process.

A gas, such as hydrogen or helium is delivered by a gas delivery means into the space between the non-planar surface of the cooling block and the substrate to promote substrate cooling. A cooling fluid supply system is also present within the cooling apparatus which is operative to provide a cooling fluid such as, for example, water, to flow through the cooling block to maintain the cooling block at a suitable temperature thereby promoting substrate cooling.

The cooling apparatus of the present invention is designed for use in a larger substrate processing apparatus having a first film deposition process chamber in which a first film deposition process is carried out at a first process temperature and a second film deposition process chamber in which a second film deposition process is carried at a second process temperature. According, to the present invention, the second process temperature is lower than the first process temperature. The cooling apparatus is established between the first and second film deposition process chambers to rapidly cool the recording disk substrate before it enters the second process chamber where it is subjected to the second process.

An advantage of the present invention is that it provides the ability to rapidly and efficiently cool a substrate to a suitable temperature without negatively affecting the information recording disk properties.

Another advantage of the present invention is that it provides the ability to maintain or enhance the coercive force properties of the magnetic film on an information recording disk.

Yet another advantage of the present invention is that it provides increased disk fabrication throughput.

BRIEF DESCRIPTION OF THE DRAWINGS

The aforementioned and related advantages and features of the present invention will become apparent from the following detailed description of the invention taken in conjunction with the following drawings where like numerals represent like elements, in which.

DETAILED DESCRIPTION OF THE INVENTION

Figure 1:
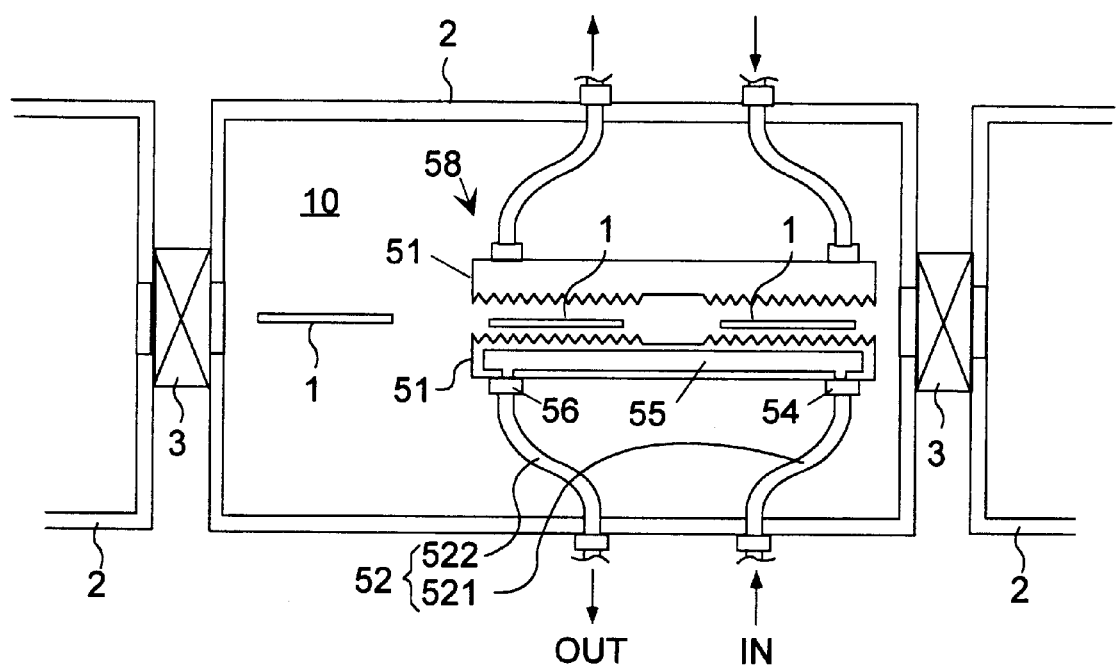
FIG. 1 presents a cross-sectional plan view of an apparatus for treating substrates according to the present invention.
Figure 2:
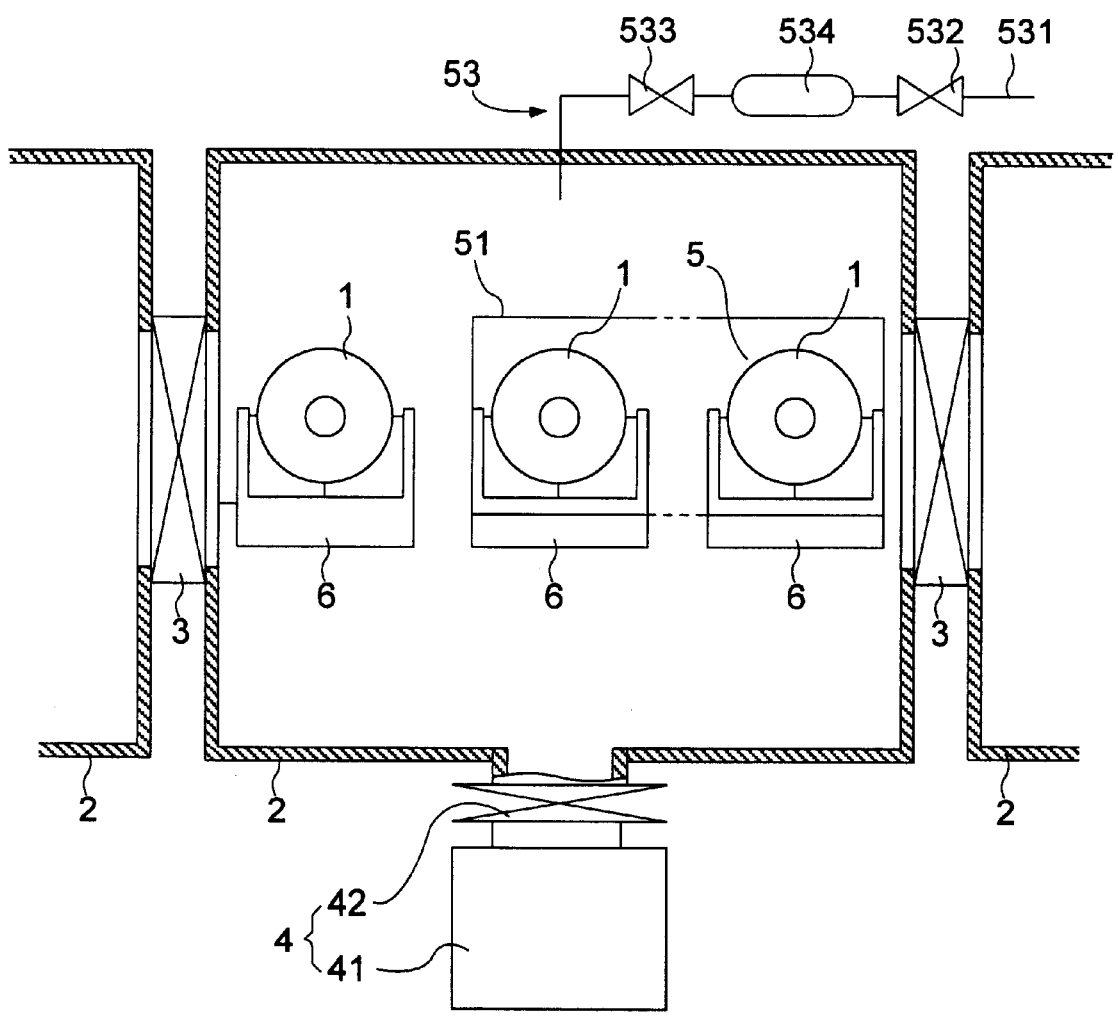
FIG. 2 presents a cross-sectional elevation view of the apparatus for treating substrates according to the present invention.

The present invention can be fully described and appreciated with reference to the Figures, in which FIGS. 1 and 2 present schematic plan and front views, respectively, of a preferred embodiment of an apparatus for treating substrates according to the present invention. The apparatus comprises a chamber 2 having an interior region 10 of sufficient size to hold at least one substrate 1 therein. The chamber 2 may be isolated from other process chambers by gate valves 3, which are opened to transfer substrates into and out of chamber 2. Chamber 2 is provided with a vacuum pumping system 4 comprising a vacuum pump 41 which, in a preferred embodiment, is a turbo molecular pump, and a main exhaust valve 42. The vacuum pumping system 4 is operative to remove air from the interior region 10 of the chamber, thereby providing a vacuum within the chamber. The substrates 1 to be treated (cooled) are supported within the interior region 10 of the chamber by a carrier mechanism 6. In this manner, the substrates are translated through the chamber 2 by a conventional transport mechanism (not shown).

Also provided within the interior region 10 of the chamber, is the cooling system 58 of the present invention that is operative to cool the substrates 1 being translated through the cooling system 58 by the transfer mechanism. In the preferred embodiment, the cooling system 58 includes cooling plates 51 made from a high thermal conductivity material, such as copper, and a gas delivery means 53, operative to deliver a cooling gas such as hydrogen (H) or helium (He) into the interior region 10 of the chamber 2. Cooling plates 51 have a non-planar top surface 50 (FIG. 3) facing the surfaces of substrates 1 to be cooled. Cooling plates 51 will be described in greater detail below. In the manufacture of magnetic disks, as described herein, both sides of the disks are employed for recording and, thus, go through the same processing steps. Accordingly, two cooling plates 51 are used. Those skilled in the art will appreciate that in other applications a single cooling plate may be all that is required.

The gas delivery means 53 includes a gas source (not shown) and piping 531 disposed to connect the gas delivery means 53 to the chamber 2. In one embodiment, the gas delivery means 53 further comprises an upstream valve 532, a downstream valve 533 and a gas reservoir 534 located between the upstream value 532 and the downstream valve 533. The gas is provided into gas reservoir 534 at a predetermined pressure, so that a given quantity of gas is contained therein. In a preferred embodiment, hydrogen is used.

Coupled to the cooling plates 51 is a cooling fluid supply system 52 which is operative to cause a cooling fluid such as water to flow through the cooling plates 51 during operation of the apparatus and thereby maintain the cooling plates 51 at a desired temperature. In one embodiment, the cooling fluid supply system 52 includes an inflow pipe 521, an outflow pipe 522 and a standard fluid pump (not shown). The inflow pipe 521 passes through the wall of the vacuum chamber 2 in a gas-tight manner and is coupled to the cooling fluid inlet port 54 of the cooling block 51. Similarly, the outflow pipe 522 passes through the wall of the vacuum chamber 2 in a gas-tight manner and is coupled to the cooling fluid output port 56 of the cooling block 51. During operation of the apparatus, the cooling fluid supply system 52 circulates water (or other suitable cooling fluid) through a central opening 55 in the cooling block 51 in order the maintain the cooling block 51 within a desired temperature range. The desired temperature is maintained by an external cooling system, such as a refrigeration system (not shown), for cooling the water. In one embodiment, the water temperature is held at about 20° C.

Figure 3:
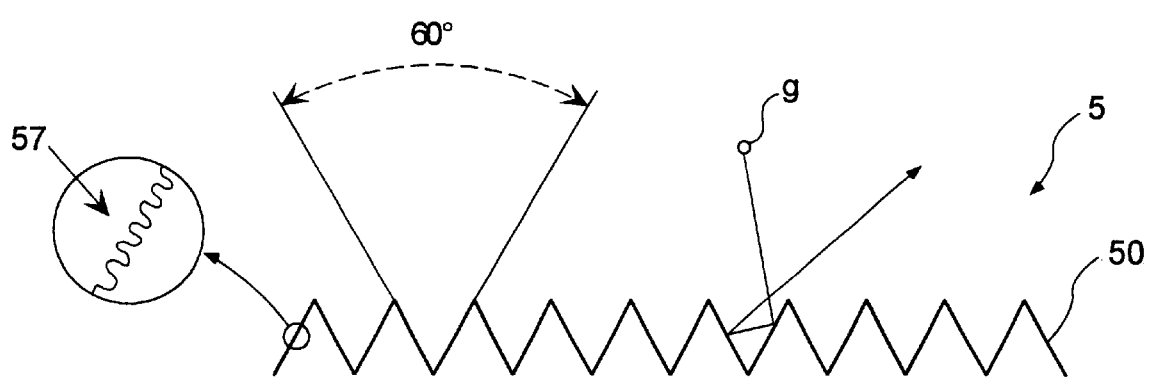
FIG. 3 presents a schematic side view of the surface of the cooling block used in the apparatus for treating substrates according to the present invention.

FIG. 3 presents a schematic cross sectional side view of the surface of a cooling block 51 of the present invention. As shown, the surface 50 of the cooling block has a saw-tooth like cross section. The saw-tooth cross sectional surface of the cooling block may be formed, for example, by cutting or moving a triangle shaped cutting tool in parallel, fixed spaced, lines across the top surface of the cooling block 51. Pyramidal grooves may be formed by forming parallel grooves in one direction and then cutting an additional grooves at a right angle to the first set of grooves. In a preferred embodiment the inclined portions of the saw-tooth grooves are formed with an angle of approximately 60°, with the depth of the grooves, measured from the top of the surface 50 of the cooling plate being in the range of about one millimeter (1 mm) to about two millimeters (2 mm). As further shown in FIG. 3, the saw-toothed grooves 50 of the cooling block 51 may further be provided with fine protrusions 57 having a substantially V-shaped cross section. These fine protrusions 57 may be created on the surface of the saw-toothed grooves by a blast treatment. For example, in one embodiment, sand or alumina particles, having a diameter of about 100 microns, are blasted onto the saw toothed grooves 50 at a pressure of about 2 kg/cm$^2$. By providing a cooling block 51 having a non-planar operating surface, as described above, the effective surface area of the cooling block becomes at least twice as large as the surface area of a conventional planar cooling surface. The benefits of having the increased cooling surface area will be discussed in greater detail below.

Although described in a preferred embodiment as having a substantially V-shaped cross-section, the fine protrusions 57 formed on the cooling grooves 50 of the cooling block 51 may also have any suitable shape. Many processes which may be used to form the protrusions will result in protrusions having somewhat random shapes. The key is to provide protrusions that will increase the effective surface area of the cooling surface 50 of the cooling block that faces, or is adjacent to, the substrate to be treated.

The method described above for providing the fine protrusions on the grooves of the cooling surface 50 is not limited to a blast process. Any other suitable physical or chemical method may be employed. For example, the fine protrusions may be provided by flame coating the cooling surface with a suitable fine granular material. Also, the fine protrusions may be provided by etching the cooling surface with a suitable etchant, for example, nitric acid.

The substrate cooling method of the present invention will now be described with reference to FIGS. 1–3. The substrate 1 to be cooled is provided within the chamber 2 through a gate valve 3 and is positioned at a distance of approximately 6 mm from the cooling surface 50 of the cooling block 51. The gate valve 3 is closed after the substrate 1 has been placed within the chamber 2. After the gate valve 3 is closed, the atmospheric pressure within the chamber 2 is reduced to at about $10^{-4}$ Pascal (Pa) by vacuum pumping system 4. The cooling fluid, in a preferred embodiment, water maintained at a temperature of approximately 20° C., is circulated through the central opening 55 of the cooling block 51 at a rate of approximately 5 liters/min by the cooling fluid supply system 52 as described above. Next, the gas delivery means 53 provides that the upstream valve 532 is placed in an open position and that the down stream valve 533 is placed in a closed position thereby causing a predetermined amount of gas, such as hydrogen, to be transferred to the gas reservoir 534.

In one embodiment, once the substrate 1 has been positioned within the chamber 2 adjacent the cooling block 51, the main exhaust valve 42 of the pumping system 4 is closed. Next, the downstream valve 533 of the gas delivery means 53 is opened causing the hydrogen gas stored in the gas reservoir 54 to be delivered to the interior region 10 of chamber 2 at a pressure in the range of between about 50 Pa and about 500 Pa, preferably approximately 200 Pa. After being delivered by the gas delivery means 53, the hydrogen gas diffuses and quickly fills the interior region 10 raising the pressure of the chamber to approximately 200 Pa. As a result of this increased pressure, the transmission of heat between the substrate 1 and the cooling block 51 is greatly enhanced through the transfer of thermal energy by the gas molecules traveling between the substrate to be cooled and the cooling plate. In addition, some of the energy is dissipated by radiation from the surface of the substrate.

The hydrogen molecules present within the interior region 10 of the chamber promote heat exchange by first contacting the substrate 1. This increases the thermal energy of the hydrogen molecules which then transport the heat energy to cooling block 51, by colliding with the cooling block (shown as g in FIG. 3). The heat received by the cooling block 51 is absorbed and removed from the chamber by the flow of the water through the cooling block. The collisions of hydrogen gas molecules between the substrate 1 and the cooling block 51 rapidly reduces the substrate temperature. After a predetermined time interval, the main exhaust valve 42 is opened and the downstream valve 533 is closed causing the chamber 2 to be placed at a predetermined post cooling pressure. Gate valve 3 is then opened and the cooled substrate 1 is transported from the chamber 2 to a subsequent processing chamber for further processing.

In testing performed by the inventors, after treating the substrate in the cooling apparatus of the present invention, a substrate was cooled from a temperature of about 165° C. to about 120° C. in about 4.6 seconds. In contrast, cooling a substrate using a cooling surface having a conventional planar surface, under the same operating conditions, took approximately 6 seconds. The rapid cooling time provided by the apparatus of the present invention was principally accomplished because the cooling block has a non-planar cooling surface adjacent to the substrate. By providing grooves on the cooling surface of the cooling block 51, the effective surface area of the cooling surface is substantially increased, thus causing an increased number of cooling gas collisions between the substrate and the cooling surface, thereby causing the substrate to cool more rapidly.

If the surface 50 of a cooling block 51 is flat, there will be, on average, only one gas molecule collision with the surface 50 of the cooling block for each collision with the substrate. On the other hand, by using a non-planar surface on cooling block 51, the probability that a hydrogen gas molecule will collide with the cooling surface 50 multiple times is increased as shown in FIG. 3. This result is further enhanced by the use of protrusions on the surfaces of the non-planar grooves. With an increased number of hydrogen gas molecule collisions between the substrate 1 and the cooling surface 51, more of the thermal energy carried by the gas molecule is imparted to the cooling block; thereby providing that more heat from the substrate 1 is absorbed by the cooling block. Consequently, by having a non-planar surface act as a cooling surface, more gas molecule collisions occur which promotes the rapid cooling of the substrate.

Now, having described the operation of the substrate cooling apparatus, the use of such a cooling apparatus will now be described in the context of a larger processing apparatus.

Figure 4:
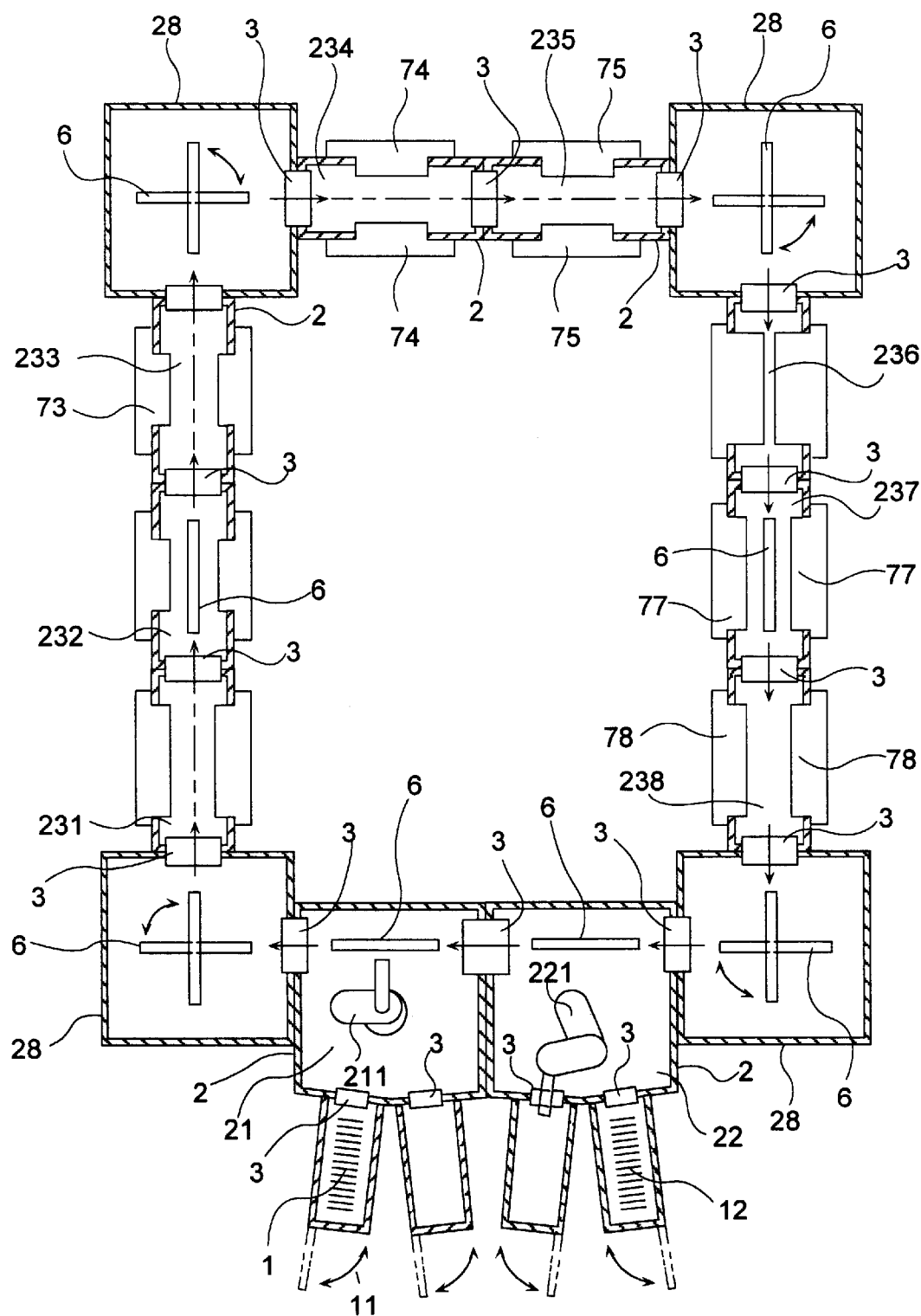
FIG. 4 presents a cross-sectional plan view of a recording disk processing apparatus incorporating the apparatus for treating substrates according to the present invention.

FIG. 4 presents a cross sectional plan view of a magnetic recording disk fabrication apparatus incorporating the substrate cooling system of the present invention. As shown in FIG. 4, the recording disk processing apparatus includes a series of substrates 1 contained within a cassette 11. The substrates 1 are mounted inside a loading chamber 21 by a mounting robot 211. The mounting robot 211 sequentially places the substrates 1 onto a carrier 6 which translates the substrates throughout the recording disk processing apparatus. A directional control mechanism 28 is employed to control the direction of travel of the carrier 6. After the substrates 1 have been loaded onto the carrier 6 by the mounting robot 211, the substrates 1 are transferred into process chambers 231 and 232 where they are heated to a temperature of about 230° C. After being heated, the substrates 1 are transferred into a film deposition process chamber 233, where a chromium (Cr) film is deposited as an undercoat film on the substrate. Sputter sources 73, disposed within the process chamber 233, deposit the chromium film onto the surfaces of the substrate by a conventional sputtering process.

After the chromium sputtering process has been completed, the sputtered substrate is then transferred to process chambers 234 and 235 where a layer of magnetic material such as CoCrTa is deposited onto the previously sputtered substrate to provide the recording layer of the information recording disk. Processing system 74, 75 within the process chambers 234 and 235, respectively, deposits the magnetic film of a prescribed thickness onto the surface of the substrate by any suitable conventional methods. The depositing of the recording layer is performed at a deposition temperature of about 200° C. to ensure that the coercive force property of the magnetic recording layer is high.

After the recording layer has been deposited onto the substrate, the substrate is transferred to process chamber 236, which includes the substrate cooling apparatus of the present invention, where the substrate is cooled to a temperature of approximately 120° C. before the protective layer is deposited onto the substrate. According to one embodiment of the present invention, the processing time required to reduce the temperature of the treated substrate from approximately 240° C. to about 120° C. is about 5 seconds.

After the temperature of the treated substrate has been reduced to about 120° C., the cooled substrate is then transferred to final process chambers 237 and 238 where a carbon film layer is deposited onto the recording layer to act as a protective layer. Processing system 77, 78 within the final processing chambers 237 and 238, respectively, deposits a carbon film of a prescribed thickness onto the treated substrate by a standard sputtering process. After the protective layer has been deposited on the substrate, the resulting information recording disk is then transferred to an unloading chamber 22 where a recovery robot 221 removes the finished substrates (information recording disks) from the carriage 6 and places them into a cassette 12 for removal from the recording disk processing apparatus.

The foregoing detailed description of the invention is provided for the purposes of illustration and is not intended to be exhaustive or to limit the invention to the precise embodiment disclosed. For example, although the preferred embodiment of the invention has been discussed with respect to a cooling apparatus being established separately from the individual processing chambers, the cooling chamber may be established as part of each of the individual film deposition process chambers. Accordingly, the scope of the present invention is to be defined by the claims appended hereto.

What is claimed is:

1. A substrate treating apparatus, comprising:
  a cooling mechanism operative to treat a substrate, said cooling mechanism including at least one cooling plate having a non-planar surface and means for circulating a cooling fluid through said cooling plate;

said non-planar surface comprising a plurality of parallel grooves, the surface of each groove having protrusions thereon;

means for positioning the substrate adjacent to said cooling plate, such that a gap is formed between said substrate and said cooling plate; and an evacuable housing having an interior region to contain said cooling plate and said substrate positioning means, whereby treatment of said substrate is accomplished by heat transfer in the gap between the non-planar surface of said cooling plate and said substrate.

2. The substrate treating apparatus of claim 1, further including gas delivery means, coupled to said housing, operative to deliver a gas into the gap between the non-planar surface of said cooling plate and said substrate.

3. The substrate treating apparatus of claim 2, further including a transfer mechanism, operative to move said substrate in working relation relative to said cooling plate.

4. The substrate treating apparatus of claim 2, wherein said gas delivery means further comprises a gas source; a gas reservoir coupled to said gas source; a first valve operative to provide a predetermined volume of gas from said gas source into said gas reservoir; and a second valve operative to provide said predetermined volume of gas from said gas reservoir into said housing.

5. The substrate treating apparatus of claim 1, further including a transfer mechanism, coupled to said positioning means, operative to move said substrate into said housing.

6. The substrate treating apparatus of claim 1, wherein said cooling plate includes a plurality of grooves formed on a surface thereof.

7. The substrate treating apparatus of claim 6, wherein said cooling plate includes v-shaped protrusions formed on a surface thereof.

8. The substrate of claim 6 which said cooling plate includes triangular shaped grooves formed on a surface thereof.

9. The substrate treating apparatus of claim 6, wherein each of said triangular shaped grooves is displaced at an angle of about 60°.

10. The substrate treating apparatus of claim 1, wherein said non-planar surface comprises at least two parallel grooves formed thereon, each of said grooves having an inclined angle of at least 45°.

11. The substrate treating apparatus of claim 10, wherein each of said grooves has an inclined angle of about 60°.

12. The substrate treating apparatus of claim 1, wherein said circulating means further comprises a first pipe, coupled to said cooling plate which provides a cooling fluid to said cooling plate and a second pipe, coupled to said cooling plate, which passes discharged cooling fluid from said cooling plate.

13. A substrate treating apparatus, comprising:

a cooling block having a non-planar surface;

said non-planar surface comprising a plurality of parallel grooves, the surface of each groove having protrusions thereon;

a cooling fluid supply system coupled to said cooling block, for circulating a cooling fluid through said cooling block;

means for positioning a substrate adjacent to said cooling block, such that a gap is formed between said cooling block and said substrate;

gas delivery means for providing a gas in the gap between said substrate and said cooling block; and an evacuated housing to enclose said cooling block and said positioning means therein, wherein treatment of said substrate is accomplished by heat transfer between said substrate and said cooling block through said gas.

14. The substrate treating apparatus of claim 13, further including a pumping system operative to establish a vacuum within an interior region of said evacuable housing.

15. The substrate treating apparatus of claim 13, wherein said non-planar surface comprises a series of parallel, angled grooves formed on a top surface of said cooling block, said angled grooves further having protrusions formed on the surfaces thereof.

16. The substrate treating apparatus of claim 15, wherein the angle of each of said grooves is about 60°.

17. The substrate treating apparatus of claim 13, wherein said cooling fluid is water.

18. A system for processing semiconductor substrates, comprising:

a first processing chamber for treating a substrate at a first processing temperature;

a second processing chamber for treating said substrate at a second processing temperature, said second processing temperature being less than said first processing temperature;

a cooling chamber, coupled between said first processing chamber and said second processing chamber, operative to reduce the temperature of said substrate from said first processing temperature to said second processing temperature, said cooling chamber comprising:

a cooling block having a non-planar top surface;

said non-planar top surface comprising a plurality of parallel grooves, the surface of each groove having protrusions thereon;

a carriage for positioning said substrate adjacent to the non-planar surface of said cooling block, such that a gap is formed between said substrate and said cooling block;

a cooling fluid supply system, coupled to said cooling block, for circulating a cooling fluid through said cooling block; and an evacuable housing to contain therein said cooling block, said carriage and said cooling fluid supply; and translating means for moving said substrates between said cooling chamber and said first and second processing chambers.

* * * * *